United States Patent [19]

Oozeki

[11] Patent Number: 5,036,760
[45] Date of Patent: Aug. 6, 1991

[54] SCREEN PRINTING MACHINE

[76] Inventor: Masanao Oozeki, 47-6-301 Sakuradai 3-chome, Nerima-ku Tokyo, Japan

[21] Appl. No.: 422,891

[22] Filed: Oct. 18, 1989

Related U.S. Application Data

[63] Continuation-in-part of Ser. No. 300,342, Jan. 23, 1989, abandoned.

[30] Foreign Application Priority Data

Apr. 28, 1988 [JP] Japan .............................. 63-103900
Jun. 6, 1988 [JP] Japan .............................. 63-137448

[51] Int. Cl.⁵ ............................................. B05C 17/04
[52] U.S. Cl. .................................. 101/123; 101/127.1
[58] Field of Search ............. 101/127, 127.1, 128–129, 101/126, 123, 114

[56] References Cited

U.S. PATENT DOCUMENTS

| | | | |
|---|---|---|---|
| 4,193,344 | 3/1980 | Ericsson | 101/123 |
| 4,254,707 | 3/1981 | Lamberg | 101/127.1 |
| 4,267,773 | 5/1981 | Scherp et al. | 101/127.1 |
| 4,589,336 | 5/1986 | Klemm | 101/123 |
| 4,715,278 | 12/1987 | Ericsson | 101/123 |
| 4,781,114 | 11/1988 | Ericsson | 101/123 |
| 4,854,229 | 8/1989 | Vassiliou | 101/123 |
| 4,858,527 | 8/1989 | Oozeki | 101/123 |
| 4,903,593 | 2/1990 | Oozeki | 101/123 |
| 4,905,592 | 3/1990 | Sorel | 101/127.1 |
| 4,909,145 | 3/1990 | Ericsson | 101/123 |

Primary Examiner—Eugene H. Eickholt
Attorney, Agent, or Firm—Burgess, Ryan & Wayne

[57] ABSTRACT

An improved printing machine includes a screen stencil supported over a surface of a material to be printed and having first and second ends, a squeegee which applies a force on the screen stencil as it travels thereacross, and the screen stencil having first and second ends, the first end being parallel to the squeegee sides and supported for movement forward and backward in accordance with forward and backward movement of the squeegee across the screen stencil so as to maintain the tension in the screen stencil constant on the side of the squeegee holding the ink.

18 Claims, 9 Drawing Sheets

SCREEN PRINTING MACHINE

REFERENCE TO RELATED APPLICATION

This application is a continuation-in-part of U.S. patent application Ser. No. 07/300,342, filed Jan. 23 1989, now abandoned, to the same inventive entity and entitled SCREEN PRINTING MACHINE.

BACKGROUND OF THE INVENTION

1. Field of the Invention

This invention relates to a performance improvement in screen printing apparatus.

2. Description of the Prior Art

Figure 1:
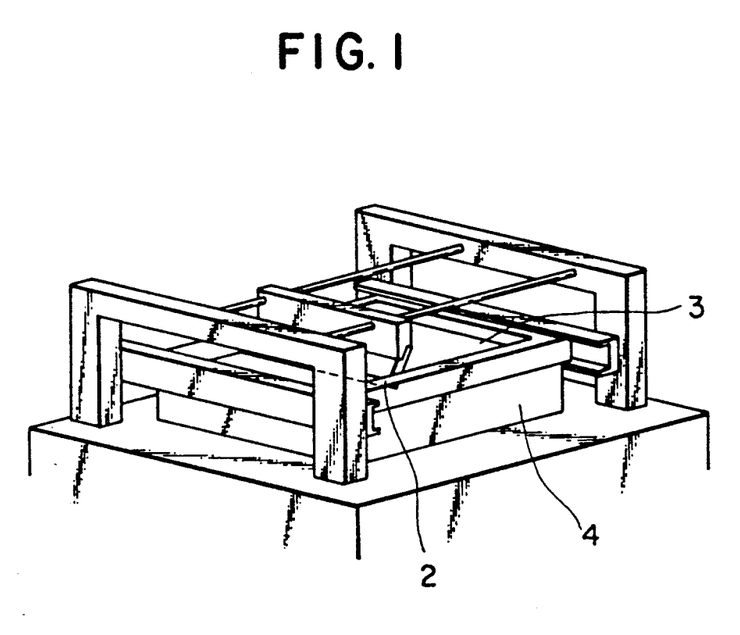
FIG. 1 is a perspective view of a screen printing machine.

In screen printing, a fine-meshed web 1 stretched in a taut state on a wooden or metal frame 4 is formed into a box-like screen, as depicted in FIG. 1. The desirable pattern is applied directly to the screen mesh by painting it with an impermeable medium. The screen stencil is then placed over the surface of a substrate to be printed, and ink is applied on the screen stencil by means of a squeegee 2. When the squeegee 2 slides across the face of the screen stencil, from one end to the other end, some of the ink goes through the permeable portions of the stencil where the medium is not painted, and is printed onto the substrate below the stencil. The impressions thus produced are an inversed copy of the original pattern.

The screen printing process is well known to be very versatile with a variety of inks. In addition, since the pattern printed comes in thick film ink, the application of a screen printing process is advantageous where impressions produced are required to have increased anti-weathering characteristics and resistance to chemicals. This printing method has to date been universally used in productions of printed circuit (PC) boards and integrated circuit (IC) boards, etc.

Figure 2A:
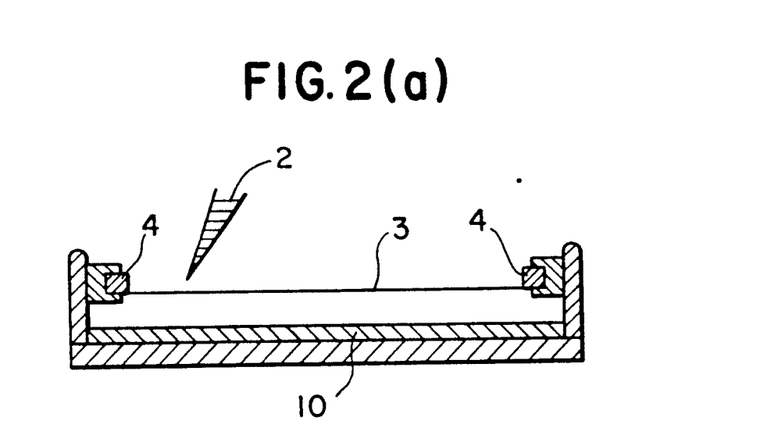
FIG. 2(a) is a schematic side cross-sectional view of the core part of a typical prior art screen printing machine in a position that the screen, with the pattern painted in it, lies parallel to the surface to be printed, with no squeegee being applied to the screen.
Figure 2B:
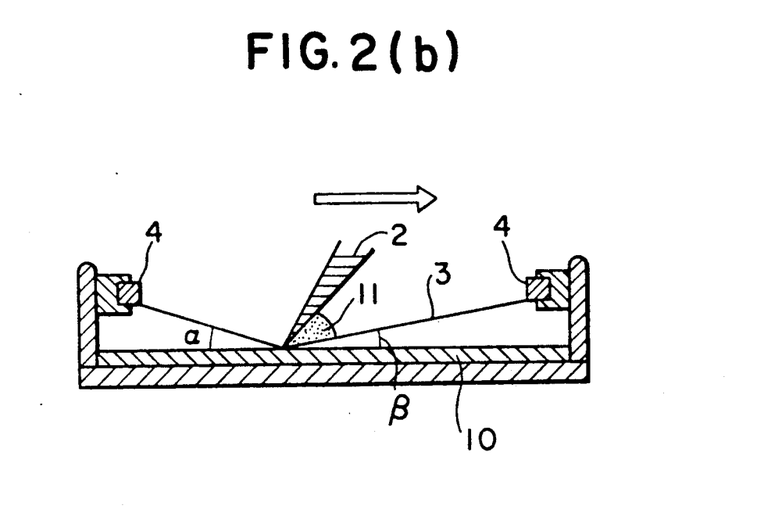
FIG. 2(b) is a schematic side cross-sectional view of the machine of FIG. 2(a) in a position that the screen, along with the pattern in it, is pressed against the surface by the squeegee in printing movement across the screen. In the diagram, $\alpha$ is the snap-off angle which the screen forms with the printed surface on the positive side of the ink held on the squeegee and which varies with movement of the squeegee, and $\beta$ is named as the incident angle.

Referring to FIGS. 2(a) and 2(b), which illustrate examples of conventional screen printing, FIG. 2(a) is a side cross-sectional view of a frame 4 with a patterned mask on a screen mesh secured in a taut condition to the four sides of the frame. When a squeegee 2 is not pressed down, the stencil lies subtantially parallel to the plane of the surface 10 to be printed, on which the mask is placed slightly spaced apart. When a squeegee 2 sweeps across the top face of the ink from one end to the other end, the stencil comes down onto the surface 10, by the pressure of the squeegee. In fact, with the sliding movement of the squeegee 2, the stencil bends into an inverted triangle, as shown in FIG. 2(b), with its apex moving across the surface 10. Since the stencil has its opposite ends held in fixed positions, the stencil in printing operation must have a physical stretch to a greater length than its original length which the stencil would have when not in printing operation by the pressure of a squeegee 2, as in FIG. 2(a).

It is well known to those versed in the art that the amount of this elongation is the smallest when the moving squeegee 2 passes the mid-point of a stencil in the printing operation. The amount of elongation increases more as the squeegee 2 slides farther away, in either direction, from that mid-point of a stencil. This phenomenon can easily be verified mathematically by the sine theorem.

A number of problems are due to the above-mentioned behavior of the stencil in the prior art screen printing process. With the elongation of the screen, the patterns formed in the stencil undergo a corresponding stretching. As a result, the images printed on the surface 10 have greater dimension than the original which the screen stencil would provide if the screen stencil were free from the pressure of the squeegee 2. In addition, the elongation in the images naturally becomes greater toward either end of the image.

In the prior art, the above-mentioned difficulties also involve another problem. When the screen stencil in a printing operation undergoes an increasing rate of elongation from the center to the ends thereof, the tension change which the squeegee 2 develops on the screen stencil also occurs in a correspondingly increasing amount. As a result, the holes in the mesh of the web screen become larger at both screen ends where screen tension reaches a maximum. Thus, more ink goes through the screen onto the surface 10 near its ends than near its center because of the enlarged holes in the mesh. Accordingly, the image is printed with larger dots of ink at its ends than at its center. Furthermore, the disproportionate amount of tension developed on a screen stencil with the sweep of the squeegee results in the shorter service life of the stencil.

In the prior art screen printing, the images obtained have disproportionate deviations from the pattern intended.

Due to the varying amount of tension developed on the screen stencil caused by the squeegee movement, the screen stencil has a shorter life. In addition, the differently expanded holes in the screen mesh produce a poor image, lacking in print quality.

It will be appreciated that, in FIG. 2(b), the snap-off angle $\alpha$ is the angle which the screen forms with the printed surface on the positive side of the ink held on the squeegee. This angle varies with movement of the squeegee, but such a variance of the snap-off angle is undesirable for keeping the distribution and thickness of the ink constant on the surface of the material to be printed.

U.S. Pat. No. 4,193,344 to Ericsson discloses a fixed squeegee and a movable stencil, respectively, in FIGS. 9-13 thereof, while FIGS. 1-8 thereof disclose a movable squeegee and a fixed stencil. Specifically, in the embodiment of FIGS. 9-12 thereof, a squeegee comprising a frame 91 having bearing means which carry a reciprocable drum 92 is fixed, that is, cannot move forward and backward (rightward and leftward thereof). Thus, in the embodiment of FIGS. 9-12 of Ericsson, it is impossible for any end of stencil 94 to move forward and backward in accordance with forward and backward movement of the squeegee. On the other hand, in the embodiment of FIGS. 1-8 thereof, frame 2, which corresponds to the end of the screen stencil, is rotated about the pivot axis 2a. However, frame 2 cannot move forward or backward. Thus, it is impossible for frame 2 to move forward and backward in accordance with movement of squeegee 4.

SUMMARY OF THE INVENTION

The present invention has been proposed to eliminate the above-described drawbacks of the prior art screen printing machines.

It is, therefore, a primary object of the present invention to provide an improved screen printing machine in which the screen has one end disposed to move backward and forward, with forward and backward movement of the squeegee, and the other end secured in fixed position. With this arrangement, the screen stencil end moves almost horizontally; that is, forward and backward with respect to the opposite screen end to a degree, so that the effective length of the screen stencil, which is defined as the length of the two inclined stencil surfaces combined together into the inverted triangle, which the screen stencil forms when it is pressed against the material surface to be printed by the squeegee in printing movement, is maintained constant. This also means that the tension which the squeegee develops on the screen stencil remains substantially constant throughout the entire movement of the squeegee across the stencil.

It is a further object of the present invention to provide a screen printing machine in which the snap-off angle in FIG. 2(b), the angle which the screen forms with the surface to be printed on the opposite side of the ink-holding squeegee side, is maintained constant so that the distribution of ink through the screen onto the material surface is kept uniform.

By contrast, in the prior art machines, this angle in FIG. 2(b) varies with the sweep of the squeegee across the screen.

It is still a further object of the present invention to provide a screen printing machine in which the snap-off angle is maintained constant by moving at least one end of the screen back and forth with movement of the squeegee.

BRIEF DESCRIPTION OF THE DRAWINGS

FIG. 3(c) is a schematic side cross-sectional view of a third embodiment of this invention in which the screen has its one end A connected to slide in a similar manner as the end A of FIG. 3(b) and its other end of B connected to adjusting means connected to a second inclined guide for linear sliding movement along the associated guide such that the angles $\alpha$ and $\beta$, which the backside of the screen forms with the surface on both sides of the squeegee can be maintained constant, regardless of the position of the squeegee, by linear movement of the screen stencil ends synchronized with the squeegee; that is, in accordance with a back and forth motion of the squeegee. The adjusting means is also adapted to enable the screen stencil to reach the material surface to be printed without a noticeable fluctuation of the tension the squeegee develops on the screen when it moves across the screen;

DETAILED DESCRIPTION OF THE INVENTION

The present invention is particularly directed to the structure of an improved screen printing machine in which the screen stencil has its one end on the side of the screen holding ink, disposed for forward and backward movement in the direction of its opposite end to a degree of the movement of the squeegee so as to keep the tension of the stencil constant.

This invention is composed of an improved screen printing machine comprising a screen stencil, held over a material surface to be printed, of which a first end of the two stencil ends to be parallel to the squeegee sides which are perpendicular to its moving direction, is supported to move on the incident angle formed between the screen stencil surface and the material surface to be printed on the ink holding side of a squeegee according to the squeegee movement across the screen stencil.

The preferred embodiments of the present invention will be described in greater detail in conjunction with the accompanying drawings.

Figure 3A:
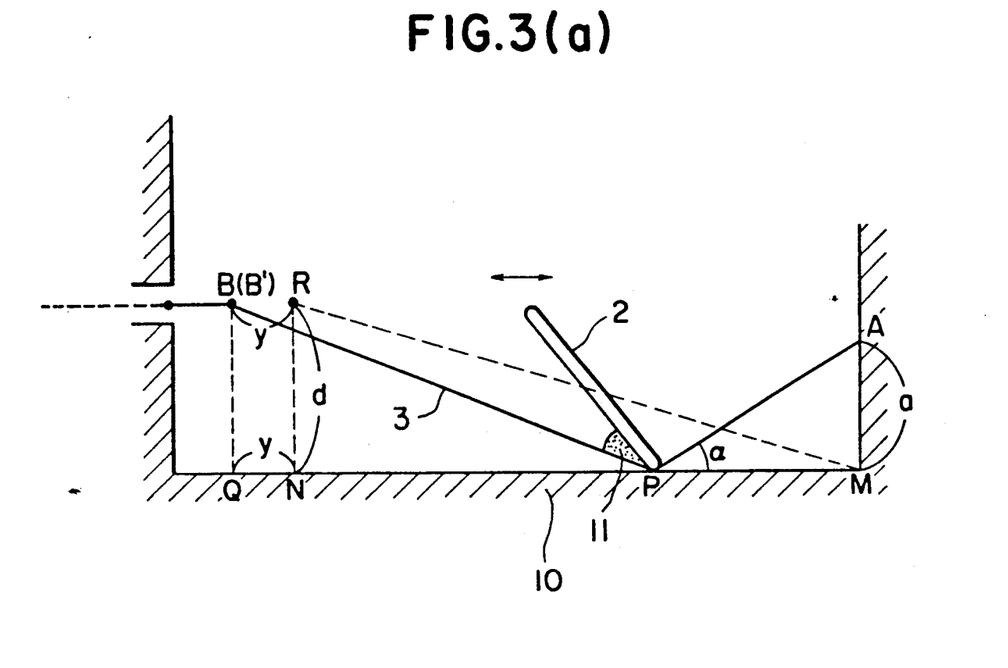
FIG. 3(a) is a schematic side cross-sectional view of a first preferred embodiment according to the present invention in which the screen of a screen printing machine, while having its one end A secured in fixed position, holds the other end B disposed to move in such a manner that the movable end can extend back and forth with the sweep of the squeegee across the screen.

Referring to FIG. 3(a), the screen stencil 3 of a printer according to the first embodiment of the present invention has one end A thereof, on the side of the squeegee opposite to that holding the ink, fixed securely. The other end B of the screen stencil 3, on the side of the squeegee holding the ink, is disposed for forward and backward sliding movement with respect to its opposite end A substantially horizontal to the plane of the material surface 10 to be printed, with the sweep of the squeegee 2 backward and forward across the screen stencil.

For further detail, the movable end B of the screen stencil 3 moves automatically to keep the effective length of the screen stencil, defined as the length of the two inclined sides of the triangle which the screen forms when it is pressed against the surface 10 by the tip P of the squeegee 2, constant throughout the entire printing movement of the squeegee 2 across the screen stencil.

It is important to emphasize that the end B of the screen stencil 3 is made to move in either direction in response to the tension which the moving squeegee develops on the screen stencil. Directional movement of the screen end B in the direction of its opposite end A alone does not provide the above-claimed and other objects of this invention.

In other words, when the squeegee 2 is applied on the screen 3 at its starting point near the screen end A, the screen end B is pulled all the way out to the direction of the screen end A. With the squeegee 2 moving to the left in FIG. 3(a) in printing, the screen end B moves away from the end A. When the squeegee 2 sweeps past the mid-point of the screen, the end B begins to move backward to the direction of its opposite end A. Thus, in order for the screen end B to be able to move in either direction, the end B must be urged in one direction through a proper elastic means.

It will be appreciated that, when squeegee 2 moves in the rightward direction of FIG. 3(a), the free moving end B moves rightward due to the screen stencil 3 being pulled rightward by squeegee 2. However, when squeegee 2 moves in the leftward direction of FIG. 3(a), the free end B cannot move leftward by itself since the screen stencil is not pushed by squeegee 2. Thus, it is necessary, in order to effect forward and backward movement (right and left movement in FIG. 3(a)), to always pull end B in the opposite direction of squeegee 2; that is, to the left in FIG. 3(a), where it is movable by the squeegee to the right against such pulling force.

With respect to FIG. 3(a), when the squeegee 2 has its tip P located at M, R is the position at which the movable end B of the screen stencil 3 takes. Also, N is the point at which the vertical through R cuts the surface 10. Q is the point at which the vertical through the home position B' of the screen end B, the point where the screen stencil 3 is supposed to have its end B located when the squeegee 2 is at the mid-point of the screen 3, intersects the suface 10. The positional relation of the moving end B of the screen stencil 3 to the squeegee 2 can be represented by the following equation:

$$x^2 + a^2 - 2l\sqrt{x^2 + y^2} = y^2 + 2y\sqrt{(l^2 + d^2)} \quad (1)$$

where y is B'R which is equal to QN, x is PM, 1 is the screen length, d is B'Q which is also equal to RN, and a is AM.

It can be established from the above that the end B of the screen stencil 3 in this embodiment moves back and forth with the movement of the tip P of the squeegee 2.

Because the screen end B reciprocates in precise response to the movement of the squeegee 2 across the screen stencil 3, the length $(\overline{AP}+\overline{BP})$ of the screen stencil is maintained constant, with the tension the squeegee develops on the screen stencil being also kept constant, regardless of the position of the squeegee tip P, unlike the prior art screen printing machines, as illustrated in FIG. 2.

Furthermore, since the resist pattern formed on the screen 3 does not vary in shape and size, the images the screen imprints on the surface 10 cannot only be a precise replica of the pattern, but also can be uniform in ink distribution. In addition, the stability of printing performance can be insured.

This first embodiment of the present invention is the simplest one, and enables the tension that the squeegee 2 exerts on the screen stencil 3 to be kept constant. However, in this embodiment, with the movement of the squeegee 2, the snap-off angle $\alpha$, the angle formed between the backside of the screen stencil and the material surface 10, varies, because the screen end A is secured in a fixed position. For the screen printer to print images of uniform ink thickness, this snap-off angle must be maintained constant, regardless of the position of the moving squeegee 2 on the screen stencil 3.

Figure 3B:
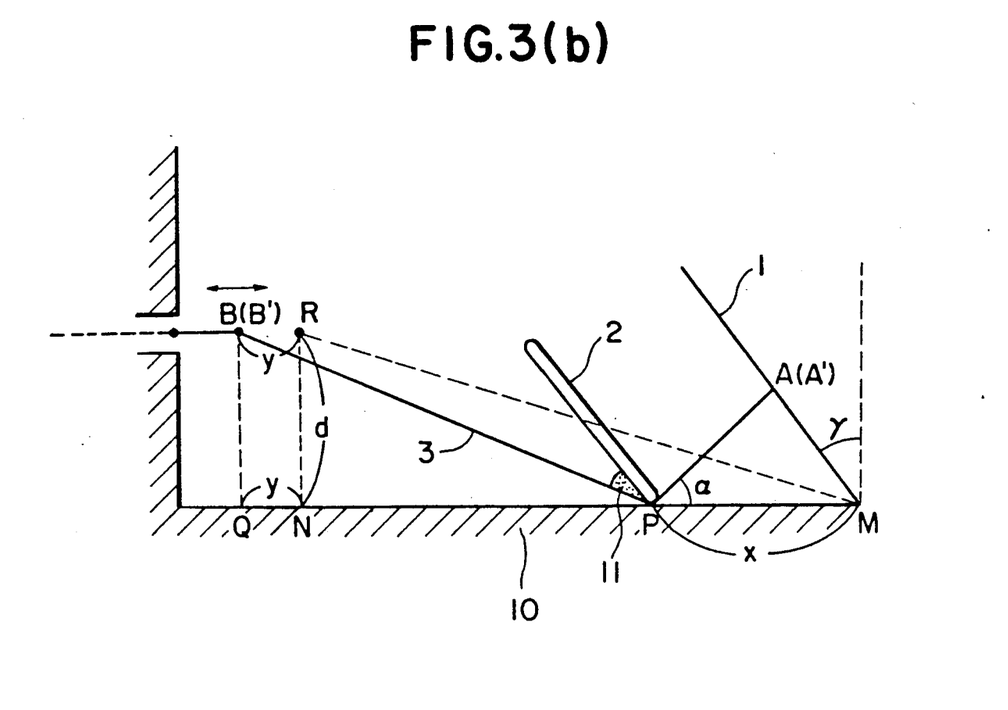
FIG. 3(b) is a schematic side cross-sectional view of a second preferred embodiment of the present invention in which the screen has one end A slidably coupled with an inclined guide for linear movement along a bar, with its other end B disposed to move in a similar manner to the end B of FIG. 3(a), such that the snap-off angle, formed between the rear of the inclined backside of the screen stencil and the material surface to be printed on the opposite side of the ink-holding squeegee side, can be maintained constant, regardless of the position of the squeegee by a sliding linear movement of the end A with the squeegee movement. The movable end A also offers the same result as its counterpart in FIG. 3(a)

Referring now to FIG. 3(b), a screen printing machine according to the second embodiment of the present invention has a screen 3, having one end A thereof connected to slide to an inclined straight guide 1 for the linear movement along the guide 1 in unison with the squeegee 2 movement, so that the snap-off angle $\alpha$ is maintained constant. The other end B of the screen is connected to move in a subtantially similar manner as its counterpart, explained in connection with FIG. 3(a), which will not be described herein for the sake of brevity. In the description which follows, reference characters B', M, N, Q and R are used to indicate, as have been employed in FIG. 3(a). A' is the point the screen end A takes in its movement along the guide.

For more detail, to keep the snap-off angle $\alpha$ constant, regardless of the position of the squeegee tip P on the screen stencil, the screen end A must be moved in such a manner that the ratio of $\overline{PM}$ to $\overline{A'M}$ is a constant value throughout the squeegee range.

Because the $\overline{PM}$ and $\overline{A'M}$ ratio is constant, regardless of the positions of the moving points A' and P, the angle $\alpha$ between $\overline{A'P}$ and $\overline{PM}$ remains unchanged.

That is, all triangles formed by the moving points A' and P in conjunction with M are always similar with one another, independent of the position of the squeegee 2 on the screen stencil 3.

The relation of the angle $\alpha$ with the movement of the squeegee 2 across the screen stencil 3 in FIG. 3(b) may be expressed by the following equation:

$$\{1 - \cos 2\gamma/\cos 2(\alpha - \gamma)\}(x^2 + y^2) + 2\{\sqrt{l^2 - d^2} + l\cos \gamma/\cos (\alpha - \gamma)\} x - 2\sqrt{l^2 - d^2}\, y - 2xy = 0 \quad (2)$$

where x is $\overline{PM}$, y is $\overline{RB'}$ which is equal to $\overline{NQ}$, 1 is the entire length of the screen stencil 3 from the end A' to the other end B through the squeegee tip P, d is $\overline{B'Q}$ which is equal to RN, and $\gamma$ is the angle between the plane of the guide 1 and the vertical through point M to the material surface to be printed.

The equation (2) above is quadratic and describes a hyperbolic or elliptical curve upon planes x and y.

Hence, introducing the sine theorem into this embodiment gives:

$$\overline{A'P}/\sin \angle A'PM = \overline{PM}/\sin \angle PA'M$$

$$\therefore A'P/\sin (90° - \gamma) = PM/\sin (90° - \alpha + \gamma)$$

$$\therefore A'P = x\cos \gamma/\cos (\alpha - \gamma)$$

$$= x/(\cos \alpha + \sin \alpha \cdot \tan \gamma)$$

This means that, for a given distance of x or $\overline{PM}$, $\overline{A'P}$, the distance between the slidable screen end A and the tip P of the squeegee 2 on the screen stencil 3 becomes smaller if the angle $\gamma$ is taken greater.

The more the angle $\gamma$ is greater than $\alpha/2$, the finer the images, which the screen stencil 3 prints on the material surface 10 become because of the movement of the squeegee 2. On the other hand, if the angle $\gamma$ is smaller than $\alpha/2$, the A'P or the distance between the squeegee tip P and slidable screen end A relative to the distance x ($=\overline{PM}$) becomes greater. As a result, the images printed would be finer.

With the preferred embodiment shown in FIG. 3(b), not only is the snap-off angle $\alpha$ maintained constant, but also the angle $\gamma$, which the guide 1 forms with the vertical plane to the material surface through point M, may be adjusted so as to provide for enhanced printing quality, particularly when $y=\alpha/2$, then $\angle PMA'=90°-\alpha/2$.

From this expression, $\Delta PA'M$ is an isosceles triangle, because of $\overline{PA'}$ being equal to $\overline{PM}$.

This particular embodiment is as follows.

According to the movement of the squeegee tip P across the screen stencil 3, the distance x (or $\overline{PM}$) changes in proportion to the change of $\overline{A'P}$. This means that the time difference of x, which is defined as dx/dt on the material surface to be printed, is equal to the time difference of $\overline{A'P}$, which is defined as $d\overline{A'P}/dt$ on the stencil surface.

The speed (dx/dt) at which the squeegee 2 runs at its tip P across the screen stencil surface is entirely the same rate at which the apex of the triangle formed by the stencil surface in contact with the material surface to be printed sweeps along the stencil 3.

If the rate of speed $d\overline{A'P}/dt$ at which $\overline{A'P}$ moves is not equal to the speed dx/dt at which the tip P of the squeegee 2 sweeps across the screen stencil 3, then it means that the apex that the triangle of the screen stencil 3 forms in contact with the surface 10 to be printed is not moving across the surface at the same speed.

That is, the relation that dx/dt is equal to $\overline{A'P}/dt$ can be established.

This expression is meant by the explanation that the relative velocity of the apex P to a supposed point on the screen stencil surface 3 is entirely the same one to a supposed point on the material surface 10 to be printed.

This fact leads us to the next conclusion that there is no difference between the velocities, so there is no slip between the back surface of the screen stencil and the material surface 10 to be printed.

Here, we can get the absolute dimension screen printer which promises us the entirely the same print as the original pattern on the master mask.

When $\gamma=\alpha/2$, it can be established that $\overline{PA'}$ is equal to PM. Accordingly, the speed of the squeegee tip P, when it moves along the screen stencil surface, which is defined as dx/dt, is equal to the speed of $\overline{A'P}$, which is defined as $d\overline{A'P}/dt$, it also means that the apex of the triangle that the screen stencil 3 forms in contact with the surface 10 moves across the material surface at the same speed.

Since the pattern coated on the screen stencil 3 is made to sweep across the surface 10 at a uniform rate of speed, the images formed on the surface would be faithful replicas of the pattern on the screen stencil.

In this case, the preferred embodiment must satisfy the following equation:

$$x = y/2 - \sqrt{l^2 - d^2} + l + d^2/2(y - \sqrt{l^2 - d^2} + l)$$

Also, the screen stencil 3 of the present embodiment has its other end B disposed to move in a similar manner as the previous embodiment described with respect to FIG. 3(a), in order to maintain constant the effective length of the screen stencil and tension which the squeegee 2 develops on the screen stencil. Because of this, this embodiment can insure uniform printing and precise reproduction from the original pattern with stability.

Furthermore, since the snap-off angle $\alpha$ can be maintained constant, the uniformity of ink thickness can be insured.

As stated above, the preferred embodiment shown in FIG. 3(b) can insure excellent printing quality, because the snap-off angle $\alpha$ and the tension the squeegee 2 exerts on teh screen stencil 3 can be kept constant.

Figure 3C:
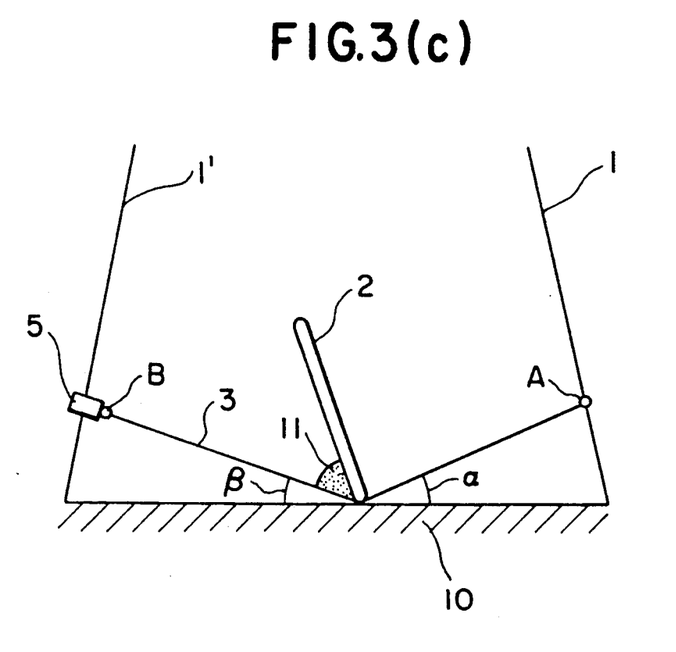

Referring now to FIG. 3(c), the screen stencil 3 of a third preferred embodiment of this invention has one end (A) thereof slidably connected on an inclined guide 1 in a substantially similar manner as its counterpart in FIG. 3(b), in order to maintain constant the snap-off angle $\alpha$ which the backside of the screen stencil forms with the surface 10 on the side of the guide 1. Also, the opposite end B of the screen stencil 3 is connected to slide on a second guide 1' for the movement along the guide 1' with the squeegee 2 movement across the screen stencil, so as to keep constant the incident angle $\beta$, which the backside of the screen stencil forms with the surface on the side of the guide 1', regardless of the position of squeegee 2.

Figure 6:
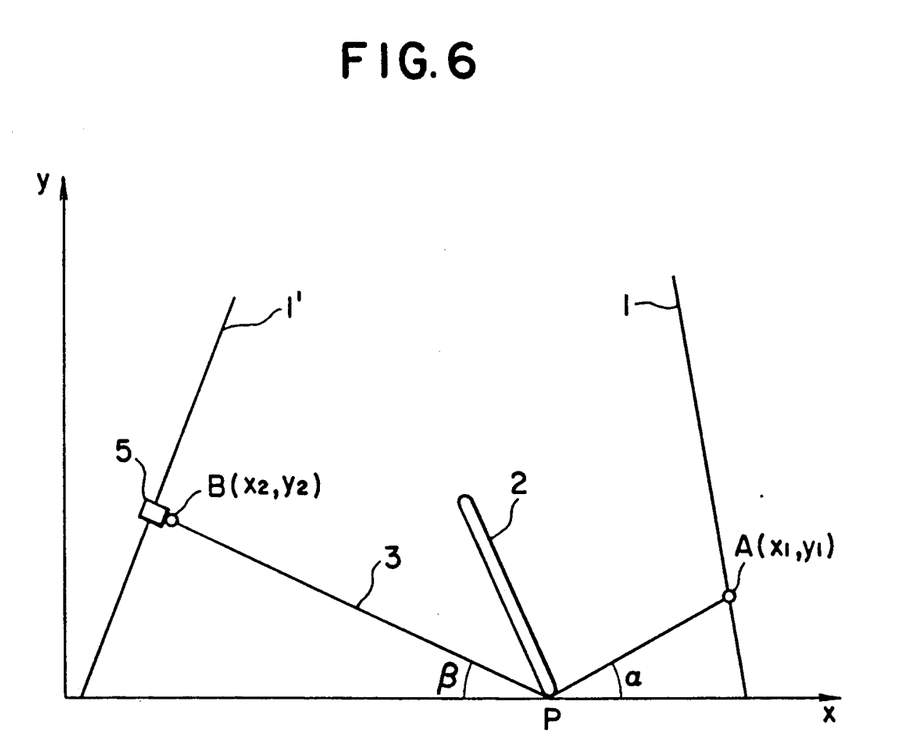
FIG. 6 is a diagram showing the locus of sliding movement of the screen ends A and B along their respective guide in the sweep of the squeegee across the screen stencil.

For the screen stencil 3 to simultaneously keep fixed its entire effective length L, the snap-off angle $\alpha$ and the incident angle $\beta$, the guides 1 and 1' each have to be so designed that the following equations are satisfied at the same time:

$$x1-x2=y1\cot\alpha+y2\cot\beta \quad (5)$$

$$y1\csc\alpha - y2\csc\beta = L \quad (6)$$

Where (x1,x2) is the locus that the screen stencil end A describes when moving along its guide 1 in the coordinate shown in FIG. 6, and (x2,y2) is also the locus that holding means 5 which holds the other screen stencil end B traces in linear movement along its guide 1', both in unison with movement of the squeegee tip P (t,O); that is, in accordance with back and forth motion of the squeegee, and by moving means.

Figure 7A:
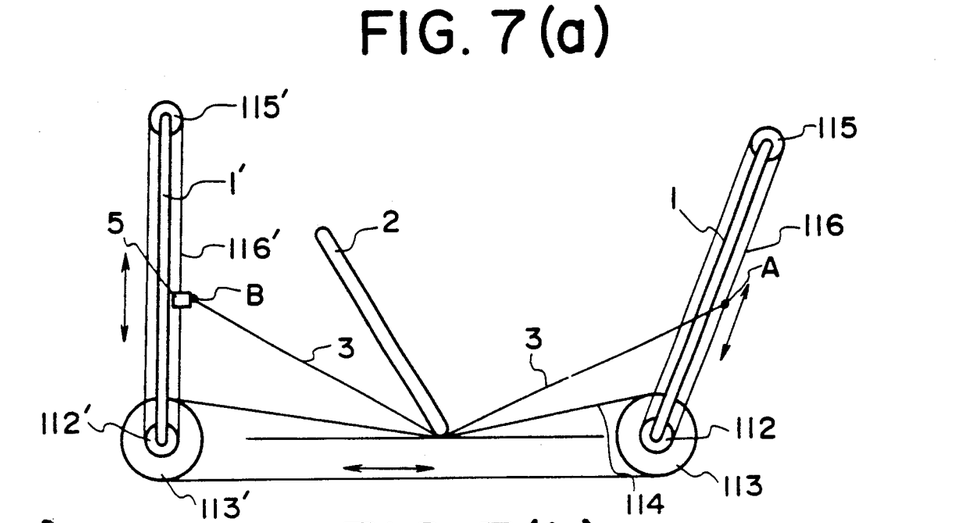
FIGS. 7(a) – 7(c) are schematic side views of further embodiments of the present invention showing the end of the screen stencil and holding means moving linearly in synchronization with movement of the squeegee in the manner shown in FIG. 3(c).
Figure 7B:
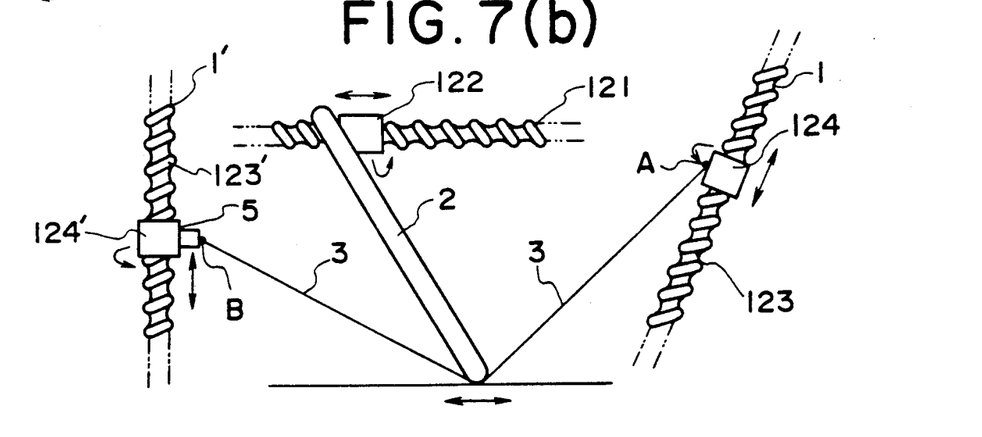
Figure 7C:
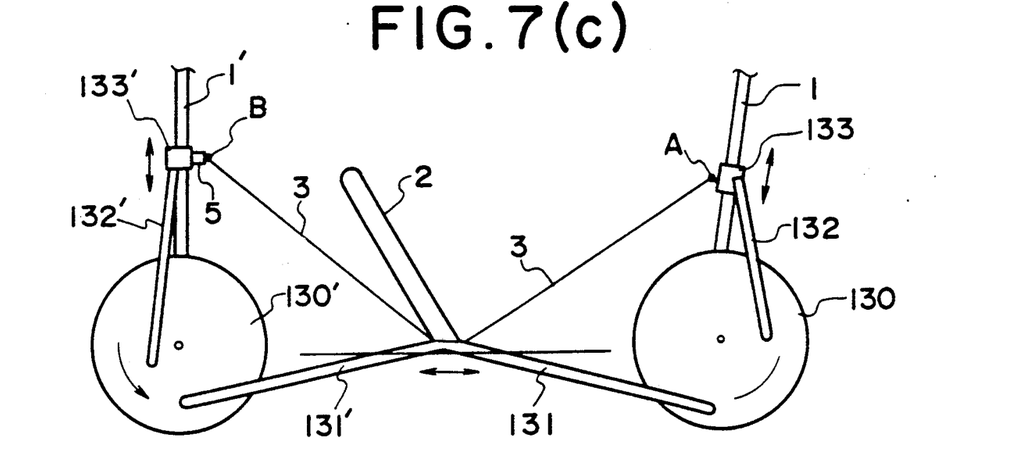

FIGS. 7(a) - 7(c) indicate disclosed embodiments of such moving means, respectively.

Referring to FIG. 7(a), the moving means comprises six pulleys 112, 112', 113, 113', 115 and 115', and endless belts 114, 116 and 116' therefor, wherein pulleys 112 and 113 rotate on a common axis and the end A holding means 5 and squeegee 2 are fixed to belts 116, 116' and 114, respectively. When pulleys 113 and 113' are driven by some mechanism (not shown in FIG. 7(a)), pulleys 112, 112', 115 and 115' rotate, and belts 114, 116 and 116' move accordingly. Therefore, movement of end A and adjusting means 5 for end B are synchronized with movement of squeegee 2.

Referring to FIG. 7(b), the moving means includes a straight elongate worm 121, an element 122 internally threaded for threaded engagement with worm 121, a straight elongate worm 123, an element 124 internally threaded for threaded engagement with worm 123, a straight elongate worm 123' and an element 124' internally threaded for threaded engagement with worm 123'. Squeegee 2, end A and adjusting means 5 are fixed to elements 122, 124 and 124', respectively, so that squeegee 2, end A and holding means 5 for end B move along worms 121, 123 and 123', respectively, through elements 122, 124 and 124' as worms 121, 123 and 123' are rotated about their axes. When rotation of worms 121, 123 and 123' are related to each other and the ratio of rotation between worms 121 and 123 and between worms 121 and 123' are maintained constant and equal to each other, movement of end A and holding means 5 for end B are synchronized with movement of squeegee 2.

Referring to FIG. 7(c), the moving means includes an element 133 slidably disposed about a linear guide 1, an element 133' slidably disposed about a linear guide 1', a rotatably disposed disk 130, a crank 131 interconnected between squeegee 2 and disk 130, a rotatably disposed disk 130', a crank 131' interconnected between squeegee 2 and disk 130', a crank 132 interconnected between element 133 and disk 130 and a crank 132' interconnected between element 133' and disk 130', wherein end A is fixed to element 133 and adjusting means 5 of end B is fixed to element 133'. When squeegee 2 moves forward or backward, movement of squeegee 2 is transmitted to end A by crank 131, rotational disk 130, crank 132 and element 133, and is transmitted to holding means 5 for end B by crank 131', rotational disk 130', crank 132' and element 133'. Therefore, movement of end A and holding means 5 for end B are synchronized with movement of squeegee 2.

When the end A and holding means connected to end B of the screen stencil 3 move linearly along their respective guides 1 and 1' in synchronization with the sweep of the squeegee 2 across the screen stencil so as to simultaneously maintain constant the length of the screen stencil, which is defined as the distance of P and PB added together in FIG. 3(c), the snap-off angle $\alpha$ and the incident angle $\beta$, the present preferred embodiment must virtually be considered to provide excellent printing performance in terms of faithful reproduction from the original pattern painted in the screen stencil 3.

However, the movement of the screen stencil ends A and B along their respective guide in synchronization with the squeegee may result in the screen stencil 3 not always maintaining constant tension the squeegee 2 develops on the screen stencil because of the following:

1. Error involved with respect to possible change in thickness of the surface 10; and 2. Error in synchronization that the end A and squeegee 2 take with each other.

In order to overcome these difficulties, holding means 5 is provided, which is slidably engaged with the guide 1' for the movement along the guide. The end B of the screen stencil 3 is connected to the holder means 5, and can move forward and backward in a direction vertical to guide 1', in accordance with forward and backward movement of squeegee 2, as shown in FIG. 3(c).

The holder means 5 also serves to offset any change in the tension which the squeegee 2 develops on the screen stencil 3 to thereby maintain constant the snap-off angle $\alpha$ and the incident angle $\beta$. As a result, faithful reproduction, uniformity in ink thickness and printing stability can be obtained.

Various modifications of the means for holding the end B of the screen stencil 3 to move will be described.

FIGS. 4(a) – 4(d) are, respectively, views of different versions of the means for holding the end B of the screen stencil to move forward and backward in accordance with forward and backward movement of squeegee 2, as shown in FIGS. 3(a) and 3(b). Each modification is designed to hold the end B of the screen stencil to move in such a manner that the end extends in the direction of the screen stencil to a degree depending on the tension the squeegee exerts on the screen stencil.

Figure 4A:
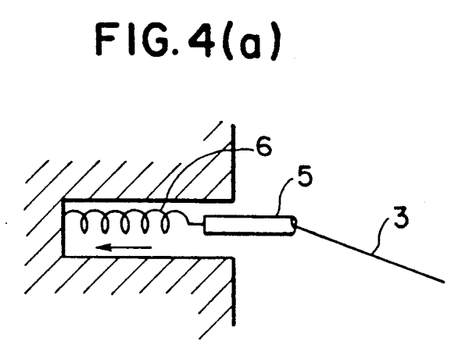
FIGS. 4(a) – 4(d) are each schematic cross-sectional views of modifications of the moving mechanism for the screen end B in FIGS. 3(a) and 3(b)

The modification of the holder means 5 depicted in FIG. 4(a) comprises rod 5 which is connected at one end thereof to one end of a compression spring 6. Also, the rod 5 is connected at its other end to the end B of the screen stencil 3. The spring 6 is secured at its opposite end to a fixed surface.

Figure 4B:
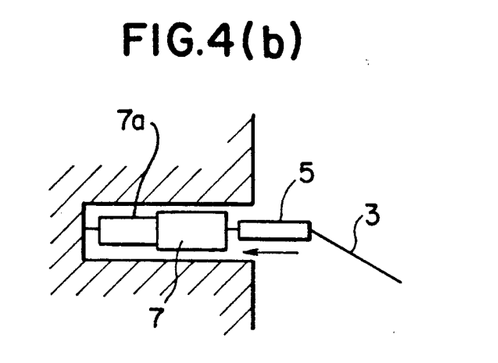

In FIG. 4(b), the holder means comprises a rod 5 connected at one end thereof to the end B of the screen stencil 3 and at its opposite end to the reciprocating piston 7a of a pneumatic cylinder 7, which, in turn, is fixedly secured at its rear end. The cylinder 7 in this embodiment is a type in which the piston 7a is urged into the bore of the cylinder.

Figure 4C:
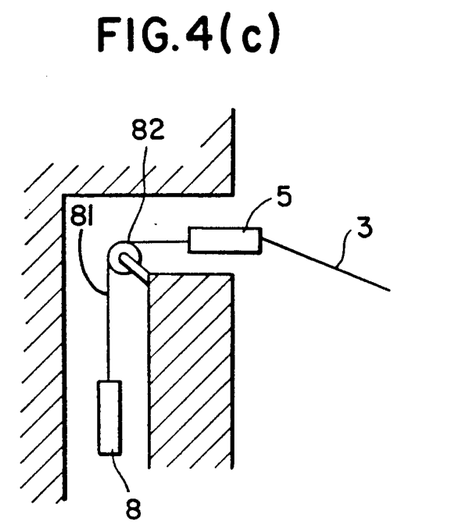

The holder means illustrated in FIG. 4(c) is also a rod 5 tied at one end thereof to a weight 8 with a string 81 that is passed around a pulley 82 in such a manner that the rod 5 is movable back and forth. The rod 5 is connected at its opposite end to the end B of the screen stencil 3. The weight 8 urges the rod 5 in the direction opposite to the other screen end A. In an alternative version, the pulley 82 may be omitted.

Figure 4D:
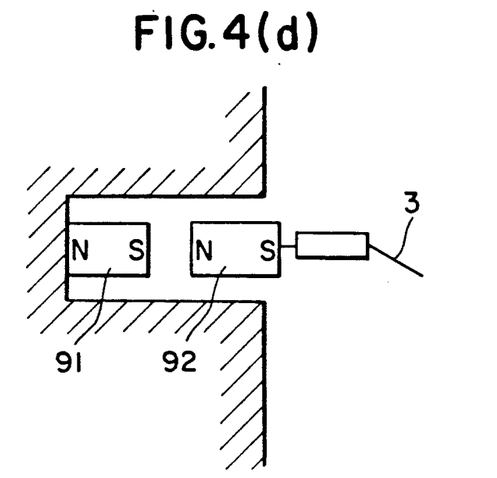

With respect to FIG. 4(d), the modification is a rod connected at one end thereof to a pair of fixed magnets 91 and a freely supported magnet 92 to which the end B of the screen stencil 3 is linked through the rod. With this arrangement, magnetic attraction between the paired magnets 91 and 92 urges the screen stencil end B in the direction opposite to the other screen stencil end A.

FIGS. 5(a) – 5(d) are, respectively, modified forms of the holder means 5 for movably holding the end of the screen stencil 3 slidably disposed in the guide 1' for free movement along the guide, as described in connection with FIG. 3(c).

Figure 5A:
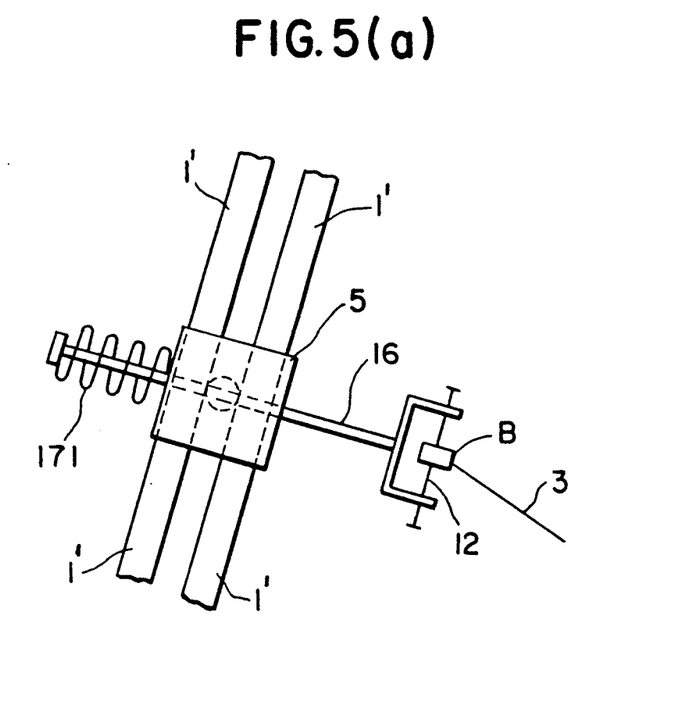
FIGS. 5(a) – 5(d) are schematic side cross-sectional views of modified versions of the adjusting means shown in FIG. 3(c)

The holder means 5 depicted in FIG. 5(a) comprises a movably disposed rod 16 connected at one end thereof on the end B of the screen stencil 3. The holder means 5 has a hole to carry therein the rod 16 in such a manner that the rod can move back and forth freely in the hole. A compression spring 171 is mounted about the movably disposed rod 16 on the opposite side of the guide 1' to the screen stencil end B in such a manner that the rod 16 is elastically urged in the direction opposite to the screen other end A. Thus, rod 16 is able to move forward and backward in a direction vertical to the second guide through the hole of the holder means, on the side opposite to the second end B of the screen held by the guide and it is adapted to urge the end B of the screen stencil in a direction opposite to the other end A and to move the end B of the screen stencil elastically so as to maintain tension in the screen stencil constant.

Figure 5B:
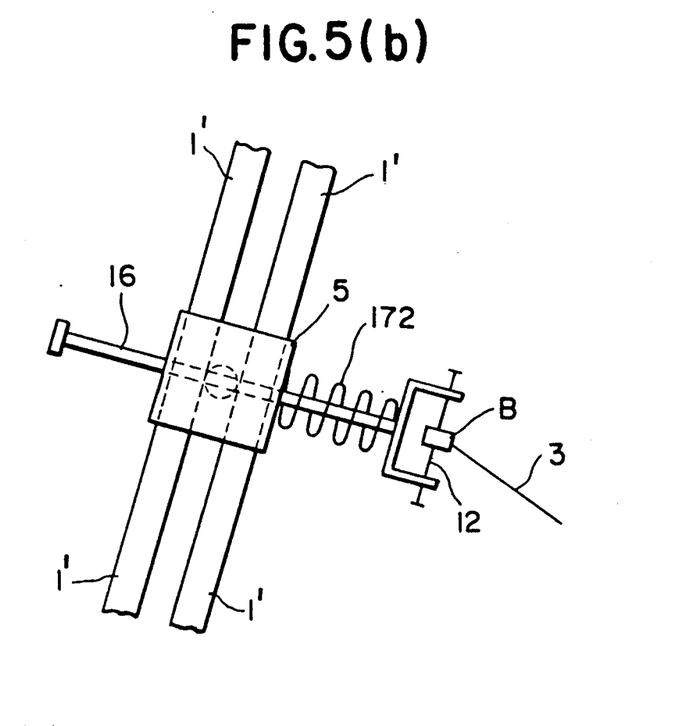

With respect to FIG. 5(b), the holder means 5 is very similar to the version of FIG. 5(a), except for a tension spring 172 which is installed about the rod 16 on the same side of the guide 1' as the screen stencil end B. The spring 172 is provided to provide the same effect as the spring 171 of FIG. 5(a).

Alternatively, each of the modifications of the holder means 5 shown in FIGS. 5(a) and 5(b) may replace the spring for an elastic rubber member which may be mounted around the rod 16 in such a manner as to urge the screen stencil end B in the direction opposite to the other end A of the screen stencil, so as to maintain the tension in the screen stencil constant.

Figure 5C:
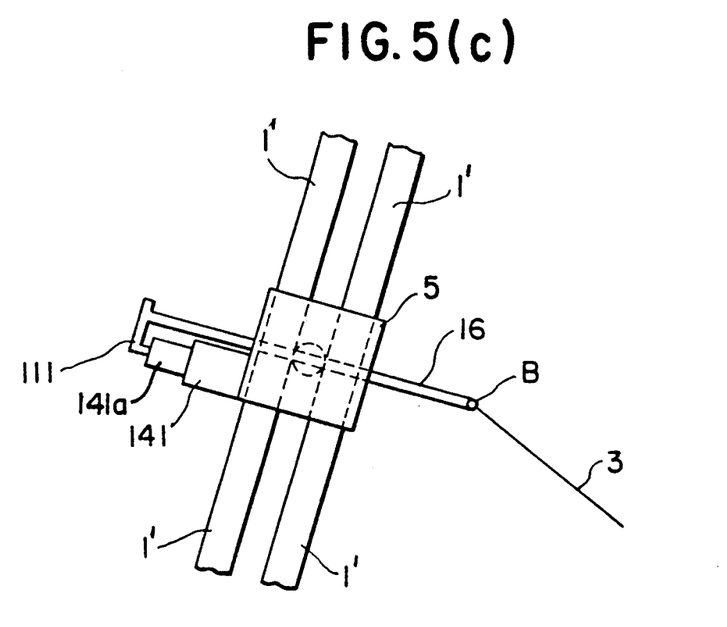

In FIG. 5(c), the holder means 5 comprises a pneumatic cylinder 141 having a reciprocable push rod 141a to which a rod 16 is engaged. The cylinder 141 in this embodiment is a type in which the rod 141a is urged away from the cylinder. The holder means has a hole bored to carry the rod 16 in such a manner that the rod can move back and forth freely in the hole. The cylinder 141 is installed on the opposite side of the bar 1' to the screen stencil end B to urge the rod 16 in the direction opposite to the other screen stencil end A. The rod 16 may be provided with a projection 111 to engage with the push rod 141a of the cylinder 141. Thus, the tension on the screen stencil is maintained constant.

Figure 5D:
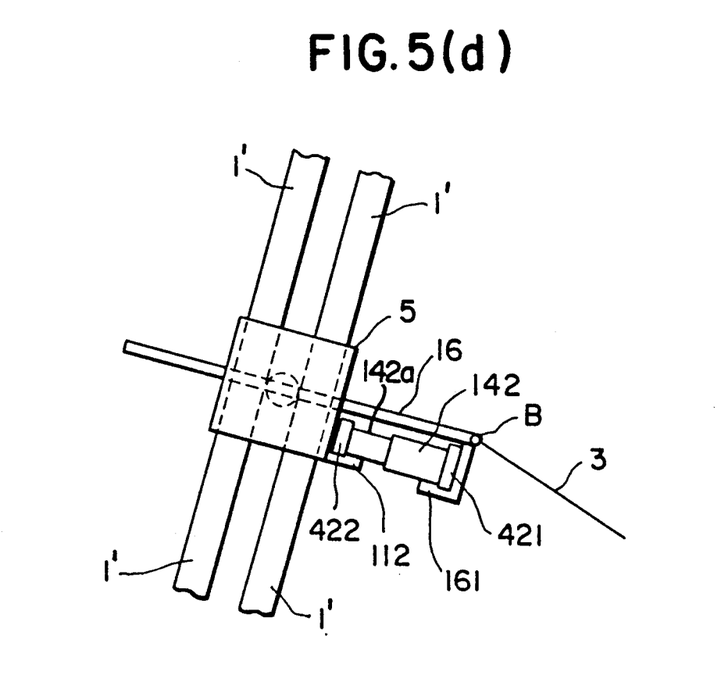

With respect to FIG. 5(d), the holder means 5 is very similar to the version shown in FIG. 5(c), except for a pneumatic cylinder 142, which is installed on the same side of guide 1' as the screen stencil end B. Also, the cylinder 142 is a type in which the piston 142a is urged inwardly into the cylinder bore. The rod 16 is engaged to the rearward end of the cylinder 142, with its reciprocating piston 142a being held against the guide 1'. The arrangement is provided to produce the same effect as the one in FIG. 5(c). The cylinder 142 may be provided at opposite ends thereof with a pair of flanges 421 and 422. Also, the rod 16 may be provided with a projection 112 to engage with the flange 421. The holder means 5 may be provided with a hook member 161 to engage with the flange 422.

In each of the modifications described in association with FIGS. 5(c) and 5(d), although the pneumatic cylinder is employed, this is a matter of choice. Any similar vacuum operated or hydraulic cylinder or other systems may be used, if it is capable of urging the rod 16 in the direction opposite to the end A of the screen stencil 3.

In addition, in each modification shown in FIGS. 5(a) and 5(b), the end B of the screen stencil 3 is connected to the holder means 5 through a pin 12 in such a manner that the end B is freely slidable in a direction parallel with the guide 1'. By contrast, the modified versions in FIGS. 5(c) and 5(d) show that the screen stencil ends B are directly connected to their respective holder means 5. Needless to say, the methods of connection shown are given by means of illustration, and should not be considered to limit the invention. Any known means may be used to connect the holder means 5 to the screen stencil end B.

The embodiment shown in FIG. 3(c) is designed to correct the following errors:

1. Vertical displacement in the surface to be printed; and

2. Failure of synchronization between the screen stencil end A and squeegee 2, and between holding means 5 connected to end B of screen stencil 3 and squeegee 2.

In the prior art printing machines, these errors would lead to a change in the entire effective length of the screen stencil and hence, the tension change that the squeegee develops in the screen. However, this embodiment can counter these errors, because means is provided to automatically adjust the incident angle to keep constant the tension in the screen.

As stated above, since the preferred embodiment of FIG. 3(c) can maintained fixed the snap-off angle $\alpha$, the incident angle $\beta$ and the tension the squeegee develops in the screen, a faithful reproduction of printed images from the pattern in the screen and excellent printing performance can be obtained.

It will be easily appreciated from the above, that the present invention holds the ends of the screen stencil movable in such a manner that the tension the squeegee exerts in the screen stencil printing operation can be maintained constant. Also, the invention includes other means which cooperate with the movably supported screen stencil end A to keep the snap-off angle constant. In the other embodiments of the invention, means are provided to maintain fixed both the snap-off and the incident angles (FIG. 3(d)). These features enable the present invention to offer extremely improved printing performance.

Since the present invention can insure uniformity in ink thickness and faithful reproduction of printed images from the screen stencil pattern, it can be used in production of printed ICs.

In addition, the tension the squeegee develops in the screen stencil service can also be insured. As a result, the present invention can also contribute to reducing costs.

What is claimed is:

1. A screen printing machine comprising:
   a screen stencil having two ends supported over a surface of a material to be printed;
   a squeegee supported for forward and backward movement on said screen stencil, so as to apply tension thereto; and
   said screen stencil having a first end parallel to sides of said squeegee which are perpendicular to the direction of movement of said squeegee on said screen stencil, said first end being supported to move forward and backward in accordance with forward and backward movement of said squeegee so as to maintain the tension of the screen stencil substantially constant on a side of said squeegee which holds ink.

2. A screen printing machine according to claim 1, wherein the other end of said screen stencil is on a side thereof corresponding to a snap-off angle and is opposite to said first end, said other end of said screen stencil being fixed so as to prevent movement thereof.

3. A screen printing machine according to claim 2, further including a first straight guide, a second straight guide, said first end of said screen stencil being parallel to said squeegee and connected to said first straight guide for moving therealong, and holder means for holding the other end of said screen stencil parallel to said squeegee and for movement along said second straight guide, such that said two ends of said screen stencil move along said first and second straight guides in unison with movement of the squeegee across said screen stencil so as to maintain both an incident angle and snap-off angle constant, said incident angle being formed between a surface of said screen stencil and the surface of the material to be printed on a side of said squeegee which holds ink and said snap-off angle being formed between said surface of said stencil and the surface of the material to be printed on a side of said squeegee opposite to the side holding the ink, said other end of said screen stencil being connected to said holding means so as to move forward and backward in a vertical direction along the second straight guide on the incident angle side of said squeegee, in accordance with forward and backward movement of said squeegee across the stencil during a printing operation so as to maintain the tension caused by squeegee movement across the stencil constant.

4. A screen printing machine according to claim 3, further including a rod connected with the other end of the screen stencil, holder means slidably movable along said second straight guide for slidably receiving said rod, and spring means mounted about said rod and in engagement with said holder means for biasing the other end of said screen stencil away from said first end thereof.

5. A screen printing machine according to claim 4, wherein said spring means includes a compression spring mounted about said movably disposed rod.

6. A screen printing machine according to claim 5, wherein said spring means includes a tension spring mounted along said movably disposed rod, and connected at one end thereof to the other end of the screen stencil so as to maintain the tension in the screen stencil constant.

7. A screen printing machine according to claim 6, further including compressive or tensional elastic material means provided between the other end of the screen stencil and said holder means.

8. A screen printing machine according to claim 7, further including a rod having one end connected to said other end of said screen stencil and movably disposed within said holder means, and said compressive or tensional elastic material means is connected between said holder means and said rod for applying a force to said other end of said screen stencil so as to elastically move said other end away from said first end.

9. A screen printing machine according to claim 8, further including a rod having one end connected to said other end of said screen stencil and movably disposed within said holder means, and said compressive or tensional elastic material means is connected between said holder means and said rod for applying a force to said other end of said screen stencil so as to elastically move said other end away from said first end.

10. A screen printing machine according to claim 9, further including rod means for holding said other end of said screen stencil, said rod means being movably disposed within said holder means, and pneumatic cylinder means provided between said holder means and said rod means for moving said other end of said screen stencil so as to maintain tension in the screen stencil constant during movement of said squeegee across said screen stencil.

11. A screen printing machine comprising: a screen stencil having two ends supported over a surface of a material to be printed;
a squeegee supported for forward and backward movement on said screen stencil, so as to apply tension thereto;
said screen stencil having a first end parallel to sides of said squeegee which are perpendicular to the direction of movement of said squeegee on said screen stencil, said first end being supported to move forward and backward in accordance with forward and backward movement of said squeegee so as to maintain the tension of the screen stencil substantially constant on a side of said squeegee which holds ink at an inclined angle which is defined as an angle which the screen stencil forms with the printed surface, said screen stencil forming a snap-off angle which is defined as the angle which the screen stencil forms with the printed surface on the opposite side of the squeegee which holds the ink;
and wherein said screen printing machine further includes a straight guide which is inclined from the normal direction with respect to the surface of the material to be printed, and stencil holder means being slidably mounted on said straight guide for holding said other end of said screen stencil and which moves proportionally to the speed of movement of the squeegee across the screen stencil.

12. The screen printing machine according to claim 11 wherein the stencil holder is slidably mounted to the straight guide by a worm element.

13. A screen printing machine according to claim 11, wherein said inclined angle is approximately one-half of the snap-off angle.

14. A screen printing machine according to claim 13, further including stencil holding means for holding said screen stencil over the surface of the material to be printed, a spring holder fixedly secured to a frame of said screen printing machine, and spring means connected between the stencil holder which holds said first end of said screen stencil and said spring holder for moving said first end of said screen stencil in accordance with movement of said squeegee across said screen stencil so as to maintain tension caused by squeegee movement across the screen stencil constant.

15. A screen printing machine according to claim 14, further including stencil holding means for holding said first end of said screen stencil, a cylinder holder fixedly secured to a frame of said screen printing machine, and cylinder means connected between said stencil holder means and said cylinder holder for moving the first end of the screen stencil in accordance with movement of the squeegee across the screen stencil so as to maintain the tension caused by squeegee movement across the screen stencil constant.

16. A screen printing machine according to claim 15, further including stencil holder means for holding said first end of said screen stencil, a weight holder fixedly secured to a frame of said screen printing machine, a weight and pulley means for connecting said weight with said stencil holder means and about said weight holder so as to move the first end of the screen stencil in accordance with movement of the squeegee across the screen stencil so as to maintain the tension caused by squeegee movement across the screen stencil constant.

17. A screen printing machine according to claim 16, further including stencil holder means for holding the first end of the screen stencil, an elastic material holder fixed to a frame of the screen printing machine, and an elastic material connected between the stencil holder means and the elastic material holder for moving the first end of the screen stencil in accordance with movement of the squeegee across the screen stencil so as to maintain the tension caused by squeegee movement across the screen stencil constant.

18. A screen printing machine according to claim 17, wherein said elastic material holder includes a first magnet fixed to a frame of the machine and said elastic material means includes a second magnet attracted by said first magnet and movable away from said first magnet in accordance with movement of the squeegee across the screen stencil so as to maintain the tension caused by squeegee movement across the screen stencil constant.

* * * * *